US009206507B2

(12) United States Patent
Lansalot-Matras et al.

(10) Patent No.: US 9,206,507 B2
(45) Date of Patent: Dec. 8, 2015

(54) NICKEL BIS DIAZABUTADIENE PRECURSORS, THEIR SYNTHESIS, AND THEIR USE FOR NICKEL CONTAINING FILMS DEPOSITIONS (71) Applicants: L'Air Liquide, Société Anonyme pour l'Etude et l'Exploitation des Procédés Georges Claude, Paris (FR); American Air Liquide, Inc., Fremont, CA (US)

(72) Inventors: Clément Lansalot-Matras, Seoul (KR); Julien Gatineau, Tsuchiura (JP); Benjamin J. Jurcik, Jr., Landenberg, PA (US)

(73) Assignees: L'Air Liquide, Société Anonyme pour l'Etude et l'Exploitation des Procédés Georges Claude, Paris (FR); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 14/347,544

(22) PCT Filed: Sep. 27, 2012

(86) PCT No.: PCT/IB2012/055171
§ 371 (c)(1),
(2) Date: Mar. 26, 2014

(87) PCT Pub. No.: WO2013/046157
PCT Pub. Date: Apr. 4, 2013

(65) Prior Publication Data
US 2014/0242298 A1    Aug. 28, 2014

Related U.S. Application Data (60) Provisional application No. 61/539,759, filed on Sep. 27, 2011.

(51) Int. Cl.
*C23C 16/18* (2006.01)
*C23C 16/455* (2006.01)
(Continued)

(52) U.S. Cl.
CPC .............. *C23C 16/18* (2013.01); *C23C 16/42* (2013.01); *C23C 16/45553* (2013.01); *H01L 21/28518* (2013.01); *H01L 21/28556* (2013.01)

(58) Field of Classification Search
None
See application file for complete search history.

(56) References Cited

U.S. PATENT DOCUMENTS 4,377,613 A    3/1983  Gordon
(Continued)

FOREIGN PATENT DOCUMENTS

DE    42 34 998    4/1994
(Continued)

OTHER PUBLICATIONS

Becht, M. et al., "Nickel thin films grown by MOCVD using Ni(dmg)$_2$ as precursor," Journal de Physique IV, Colloque C5, Journal de Physique II supplement, vol. 5, Jun. 1995, pp. C5-465-C5-472.
(Continued)

*Primary Examiner* — Joseph Miller, Jr.
(74) *Attorney, Agent, or Firm* — Patricia E. McQueeney (57) ABSTRACT

Disclosed are homoleptic diazabutadiene nickel precursors used for the vapor deposition of nickel-containing films. The precursors have the general formula Ni(R-DAD)$_2$, wherein R-DAD stands for substituted 1,4-diazabuta-1,3-diene ligands. The sole presence of the Ni—N bonds was also considered to avoid too high intrusion of other elements, such as carbon, into the nickel-containing films. The flexibility of the Ni—N bond in terms of film deposition also allows using the molecules for nickel, nickel-nitride, nickel-carbonitride, nickel oxide or any other type of nickel-containing films. The nickel-containing film depositions can be carried out by thermal and/or plasma-enhanced CVD, ALD, and pulse CVD or any other type of depositions methods.

18 Claims, 2 Drawing Sheets

Ni(iPr-DAD)$_2$ (51) Int. Cl.
  *H01L 21/285* (2006.01)
  *C23C 16/42* (2006.01)

(56) References Cited

U.S. PATENT DOCUMENTS

| | | | |
|---|---|---|---|
| 4,419,386 | A | 12/1983 | Gordon |
| 4,718,929 | A | 1/1988 | Power et al. |
| 5,051,278 | A | 9/1991 | Paz-Pujalt |
| 5,165,960 | A | 11/1992 | Platts |
| 5,271,956 | A | 12/1993 | Paz-Pujalt |
| 5,656,338 | A | 8/1997 | Gordon |
| 5,728,856 | A | 3/1998 | Denk |
| 6,303,718 | B1 | 10/2001 | Becke et al. |
| 6,969,539 | B2 | 11/2005 | Gordon et al. |
| 7,560,581 | B2 | 7/2009 | Gordon et al. |
| 7,754,908 | B2 | 7/2010 | Reuter et al. |
| 2005/0079290 | A1 | 4/2005 | Chen et al. |
| 2006/0138393 | A1 | 6/2006 | Seo et al. |
| 2007/0042224 | A1 | 2/2007 | Reuter et al. |
| 2007/0072415 | A1 | 3/2007 | Suzuki |
| 2008/0118636 | A1 | 5/2008 | Shin et al. |
| 2008/0141917 | A1 | 6/2008 | Clark |
| 2008/0210973 | A1 | 9/2008 | Chen et al. |
| 2008/0226924 | A1 | 9/2008 | Okubo et al. |
| 2008/0261053 | A1 | 10/2008 | Arndt et al. |
| 2009/0036697 | A1 | 2/2009 | Tada et al. |
| 2009/0072285 | A1 | 3/2009 | Hwang |
| 2009/0274930 | A1 | 11/2009 | Remington, Jr. |
| 2009/0321733 | A1 | 12/2009 | Gatineau et al. |
| 2012/0171092 | A1* | 7/2012 | Kiernan et al. ............ 423/215.5 |
| 2013/0164456 | A1* | 6/2013 | Winter et al. ................ 427/535 |
| 2015/0170961 | A1* | 6/2015 | Romero et al. ............ 427/248.1 |

FOREIGN PATENT DOCUMENTS

| | | |
|---|---|---|
| EP | 0 125 721 | 11/1984 |
| EP | 1 293 509 | 3/2003 |
| EP | 1 806 427 | 7/2007 |
| JP | 2006 124743 | 10/2006 |
| WO | WO 83/01018 | 3/1983 |
| WO | WO 96/40448 | 12/1996 |
| WO | WO 98/16667 | 4/1998 |
| WO | WO 00/23635 | 4/2000 |
| WO | WO 00/29637 | 5/2000 |
| WO | WO 01/66816 | 9/2001 |
| WO | WO 02/27063 | 4/2002 |
| WO | WO 03/083167 | 10/2003 |
| WO | WO 2006 107121 | 10/2006 |
| WO | WO 2008/034468 | 3/2008 |
| WO | WO 2008/057616 | 5/2008 |
| WO | WO 2008/008319 | 1/2009 |
| WO | WO 2009/087609 | 6/2009 |
| WO | WO 2011 032272 | 3/2011 |
| WO | WO 2012 027357 | 3/2012 |
| WO | WO 2012 067439 | 5/2012 |
| WO | WO 2013/046155 | 4/2013 |

OTHER PUBLICATIONS

Brissonneau, L. et al., "MOCVD-processed Ni films from nickelocene. Part I: Growth rate and morphology," Chem. Vap. Deposition, 1999, vol. 5, No. 4, pp. 135-142.

Daff, P.J. et al., "Stable formally zerovalent and diamagnetic monovalent niobium and tantalum complexes based on diazadiene ligands," J. of Am. Chem. Soc., 2002, 124, pp. 3818-3819.

Dieck, H. tom et al., "Diazadiene complexes of Group 4 metals. I. Synthesis of mono-, bis-and tris(diazadiene)titanium complexes and the structure of diazadienedichlorotitanium," Inorganica Chimica Acta, 177 (1990), pp. 191-197.

Diercks, R. et al., "Diazadiene als Steuerlioganden in der homogenen Katalyse, IX. Katalytische Cyclotetramerisierung von Propiolsäureestern," Chem. Ber. vol. 118, No. 2 (1985), pp. 428-435.

Frühauf, H.-W., "Koordination von 1,4-Diaza-1,3-Dienen dad an Carbonyldieisen Fragmente," J. of Organometallic Chem., 301 (1986), pp. 183-193.

Kada, T. et al., "Volatile CVD precursor for Ni Film: Cyclopentadienylallynickel," J. of Crystal Growth, 275 (2005), pp. e1115-e1119.

Kang, J.-K. et al., "Metalorganic chemical vapor deposition of nickel films from $Ni(C_5H_5)_2/H_2$," J. Mater. Res., vol. 15, No. 8, Aug. 2000, pp. 1828-1833.

Knisley, T.J. et al., Volatility and high thermal stability in mid- to late-first-row transition-metal diazadienyl complexes, Organometallics, 2011, 30, pp. 5010-5017.

Li, Z. et al., "Direct-liquid-injection chemical vapor deposition of nickel nitride films and their reduction to nickel films," Chem. Mater., 2010, 22, pp. 3060-3066.

Lim, B.S. et al., "Synthesis and characterization of volatile, thermally stable, reactive transition metal amidinates," Inorg. Chem. 2003, 42, pp. 7951-7958.

Maruyama, T. et al., "Nickel thin films prepared by chemical vapor deposition from nickel acetylacetonate," J. of Materials Science, 28 (1993), pp. 5345-5348.

Min, K.-C. et al., "NiO thin films by MOCVD of $Ni(dmamb)_2$ and their resistance switching phenomena," Surface & Coatings Technology, 201 (2007), pp. 9252-9255.

Spee, C.I.M.A. et al., "Deposition of titanium nitride thin films at low temperatures by CVD using metalorganic and organometallic titanium compounds as precursors," Journal de Physique IV, Colloque C3, Journal de Physique II supplement, vol. 3, Aug. 1993, pp. 289-296.

Svoboda, M. et al., "Bis(diazadien)metal(O) complexes, III [1], Nickel(O)-bis(chelates) with aliphatic N-substituents," Naturforsch. 36b, 1981, pp. 814-822.

Yang, T.S. et al., "Atomic layer deposition of nickel oxide films using $Ni(dmamp)_2$ and water," J. Vac. Sci. Technol. A 23(4), Jul./Aug. 2005, pp. 1238-1243.

International Search Report and Written Opinion for corresponding PCT/IB2012/055171, Jan. 30, 2013.

Asplund, M.C. et al., "Time-resolved infrared dynamics of C-F bond activation by a tungsten metal-carbonyl," The Journal of Physical Chemistry B., vol. 110, No. 1, Jan. 1, 2006, pp. 20-24.

Boo, J.H. et al., "Growth of magnesium oxide thin films using single molecular precursors by metal-organic chemical vapor deposition," Thin Solid Films 341 (1999), 63-67.

Bruder, H., "3. Diazadien-Metall(O)-Komplexe," Dissertation, Frankfurt Univ., Frankfurt, Germany 1977, 133-216 and English translation.

Burt, R.J. et al., "The preparation of mono($n^5$-cyclopentadienyl) complexes of niobium and tantalum," Journal of Organometallic Chemistry, (1977), (129), C33-C35.

Cho, S.-I. et al., "Improvement of discharge capacity of $LiCoO_2$ thin-film cathodes deposited in trench strucure by liquid-delivery metalorganic chemical vapor deposition," Aplied Physics Letters, May 12, 2003, vol. 82, No. 19, 3345-3347.

Choi, J. et al., "Composition and electrical properties of metallic Ru thin films deposited using $Ru(C_6H_6)(C_6H_8)$ precursor," Jpn. J. Appl. Phys., 2002, vol. 41, 6852-6856.

Choi, B-J et al. "Cyclic PECVD of $Ge_2Sb_2Te_5$ films using metal-lorganic sources." J. Electrochem. Soc., 154 (4) H318-H324 (2007).

Dieck, H. tom et al., "Ruthenium complexes with diazadienes. 4. Arene diazadiene ruthenium(II) complexes $[\eta^6$ -arene)(RN-CR'—CR'=NR)Ru(L)]$^{n+}$L-Cl, I, alkyl; n=2, L=MeCN, $\eta^2$-$C_2H_4$) and arene diazadiene ruthenium(0)," Organometallics 1986, 5, 1449-1457.

Fischer, H. et al., "Ungewöhnloche 1,4-Insertion eines 1,4-Diazabutadiens in die C-H-Bindung von Benzyliden(pentacarbonyl)wolfram," Journal of Organometallic Chemistry, vol. 399, No. 1-2, Dec. 1, 1990, pp. 153-162.

Fragala, M.E. et al., "Synthesis, characterization, and mass transport properties of a self-generating single-source magnesium precursor for MOCVD of $MgF_2$ films," Chem. Mater 2009, vol. 21, No. 10, 2062-2069.

Fujihara, S. et al., "Preparation and characterization of $MgF_2$ thin film by a trifluoroacetic acid method," Thin Sold Films 1997, vol. 304, 252-255.

(56) References Cited

OTHER PUBLICATIONS

Gesheva, K.A. et al., "CVD—technology of transition metal oxides and their impact on solar energy utilization," J. Phys. IV France, vol. 3, No. C3, Aug. 1993, Proceedings of the Ninth European Conference on Chemical Vapour Deposition, C3-475-C3-483.

Glatz, F. et al. "Thermal CVD of amorphous germanium films from 2,5-bis(tert.-butyl)-2,5-diaza-1-germa-cyclopentane organometallic precursor." Mat. Res. Soc. Symp. Proc.,1994, vol. 336, 541-545.

Groenen, P.A.C. et al., "Mechanism of the reaction of $WF_6$ and Si," Applied Surface Science 78, 1994, pp. 123-132.

Herrmann, W.A. et al. "Stable cyclic germanediyls ("cyclogermylenes"); Synthesis, structure, metal complexes, and thermolyses." Angew. Chem. Int. Ed. Engl., (1992) 31, No. 11, 1485-1488.

Herzog, A. et al., "Trimethyltin fluoride: a new fluorinating reagent for the preparation of organometallic fluorides," Organometallics (1994), 13(4), 1251-1256.

Jansson, U., "Ultra-high vacuum CVD of W and $WSi_2$ films by Si reduction of $WF_6$," Applied Surface Science 73, 1993, pp. 51-57.

Jipa, I. et al., "'[cis-(1,3-Diene)$_2$ W(CO)$_2$] complexes as MOCVD precursors for the deposition of thin tungsten—tungsten carbide films," Chemical Vapor Deposition 2010, 16, pp. 239-247.

Kaplan, L.H. et al., "The deposition of molybdenum and tungsten films from vapor decomposition of carbonyls," J. Electrochem. Soc.: Solid State Science, May 1970, pp. 693-700.

Kim, R-Y et al. "Structural properties of $Ge_2Sb_2Te_5$ thin films by metal organic chemical vapor deposition for phase change memory applications." App. Phys. Lett., 89 (2006) 102107.

Kinzel, A., "Synthese Einiger Diazadien-Elementverbindungen ihre Reaktivität and Katalytische Wirksamkeit," Dissertation, Hamburg University, Hamburg, Germany 1979, 46-93 and English translation.

Kukli, K. et al., "Atomic layer deposition of Ru films from bis(2,5-dimethylpyrrolyl) ruthenium and oxygen," Thin Solid Film, 520 (2012) 756-2763.

Lee, J. et al. "GeSbTe deposition for the PRAM application". Appl. Surf. Sci., 253, pp. 3969-3976, 2007.

Ogura, A. et al., "W chemical-vapor deposition using ($i$-$C_3H_7C_5H_4$)$_2WH_2$," J. Vac. Sci. Technol. A 26(4), Jul./Aug. 2008, pp. 561-564.

Pilvi, T. et al., "Atomic layer deposition of $MgF_2$ thin films using $TaF_5$ as a novel fluorine source," Chem. Mater. 2008, 20, 5023-5038.

Pilvi, T. T et al.' "Atomic layer deposition process with $TiF_4$ as a precursor for depositing metal fluoride thin films," Applied Optics 2008, vol. 47, No. 13, C271-C274.

Pilvi, T. et al., "Study of a novel ALD process for depositing $MgF_2$ thin films," Journal of Mater. Chem.. 2007, 17, 5077-5083.

Prokop, J. et al. "Selective deposition of amorphous germanium on Si with respect to $SiO_2$ by organometallic CVD." J. NonCryst. Solids, 198-200 (1996), 1026-1028.

Putkonen, M. et al., "Atomic layer deposition of lithium containing thin films," Journal of Materials Chemistry, 2009, 19, 8767-8771.

Razuvaev, G.A. et al. "Organosilicon and organogermanium derivatives with silicon-metal and germanium-metal bonds," http://media.iupac.org/publications/pac/1969/rldf/1903x0353.pdf.

Schormann, M. et al., "Diphenyllead difluoride and trisphenylbismuth difluoride: new fluorinating reagents for the chlorine-fluorine metathesis reactions of Group 4 and 5 compounds" Journal of Fluorine Chemistry 101 (2000), 75-80.

Shibutami, T. et al., "A novel ruthenium precursor for MOCVD without seed ruthenium layer," Tosoh R&D Review, 2003, 47, 61-63.

Souquet, J.L. et al., "Thin film lithium batteries," Solid State Ionics 148 (2002), 375-379.

Spee, C.I.M.A. et al., "Tungsten deposition by organometallic chemical vapour deposition with organotungsten precursors," Materials Science and Engineering, B17, 1993, pp. 108-111.

Stramare, S. et al., "Lithium lanthanum titanates: a review," Chem. Mater. 2003, 15, 3974-3990.

Sun, Y.-M. et al., "Low temperature chemical vapor deposition of tungsten carbide for copper diffusion barriers," Thin Sold Films 397, 2001, pp. 109-115.

Toyoda, N. et al., "$MgF_2$ and $LaF_3$ thin film formation with gas cluster ion beam assisted deposition," Surface & Coatings Technology 2007, vol. 201, 8620-8623.

Yamamoto, Y. et al., "Selective growth of W at very low temperatures using a $WF_6$-$SiH_4$ gas system," Electrochemical Society Proceedings on CVD-XIII, 1996, vol. 96-5, pp. 814-820.

Yamamoto, Y. et al., "Surface reaction of alternately supplied $WF_6$ and $SiH_4$ gases," Surface Science 408, 1998, pp. 190-194.

Zinn, A. et al., "Reaction pathways in organometallic chemical vapor deposition (OMCVD)," Advanced materials 4, 1992, No. 5, pp. 375-378.

International Search Report and Written Opinion for related PCT/US2010/058340, Jun. 13, 2012.

International Search Report and Written Opinion for related PCT/IB2012/055169, Jan. 2, 2013.

International Search Report and Written Opinion for related PCT/IB2012/002554, Apr. 2, 2013.

\* cited by examiner

FIG 1 – Ni(iPr-DAD)₂

FIG 2 – Ni(tBu-DAD)₂

FIG 3 – Ni(iPr-DAD)$_2$

NICKEL BIS DIAZABUTADIENE PRECURSORS, THEIR SYNTHESIS, AND THEIR USE FOR NICKEL CONTAINING FILMS DEPOSITIONS

CROSS REFERENCE TO RELATED APPLICATIONS

The present application is a 371 of International PCT Application PCT/IB2012/055171, filed Sep. 27, 2012, which claims the benefit of U.S. Provisional Application Ser. No. 61/539,759 filed Sep. 27, 2011, each of which is herein incorporated by reference in its entirety for all purposes.

TECHNICAL FIELD

Disclosed are homoleptic diazabutadiene nickel precursors, their synthesis, and their use for the vapor deposition of nickel-containing films.

BACKGROUND

Chemical vapor deposition (CVD) and atomic layer deposition (ALD) have been applied as techniques for depositing thin films for semiconductor devices because they enable the achievement of conformal films (metal, oxide, nitride . . . etc) through fine tuning of parameters during the process. The film growth is mainly controlled by the chemical reaction of metal-organic compounds (precursors), so the development of optimum precursors is essential under prediction of its property and reaction process. Precursors have been developed to attain required properties based on its specific application to certain types of film.

Several intrinsic properties of precursors should be considered before using them as molecules for CVD and ALD processes. First, liquid form and/or sufficient vapor pressure are necessary for easy delivery of the precursor in a gas phase into the reaction chamber from the containing vessel. Second, long term thermal stability in storage conditions and at delivery conditions is required. Thermal stability in the gas phase is also required to avoid incorporation of impurities into the film. Third, strong reactivity toward reaction gases, such as ammonia or oxygen, is required for the precursor to be readily converted into the desired film on the sample substrate. Another important requirement of precursor to be considered at the step of precursor design is to control impurities in the film, which usually originate from the ligand during the deposition process.

Silicide process is considered essential in the complementary metal-oxide-semiconductor (CMOS) for lowering contact resistance as the devices are scaled down. $TiSi_2$ and $CoSi_2$ have been extensively investigated as contact material. However these materials have been reported to have serious problems at sub-65 nm technology node. In addition sheet resistance of $TiSi_2$ steeply increases with scaling down, which routinely is called narrow line effect. Although $CoSi_2$ has immunity to narrow line effect, the greater consumption of Si is a major concern in forming silicides with the decreased junction depth.

Meanwhile, NiSi has become a serious candidate as a contact material thanks to its immunity to narrow line effect, low silicon consumption, and low resistivity. NiSi can be formed through a self-aligned silicide process. However physical vapor deposition (PVD) is becoming unsuitable for nanoscale deposition due to poor step coverage in high aspect ratio contact holes. Therefore Atomic Layer Deposition (ALD) is a promising deposition method for this purpose due its excellent conformality in 3D structures and atomic thickness controllability. Until now, although several studies on nickel ALD have been performed, they have shown limitations such as complex process, high impurity content, or low growth rate.

Alternatively Nickel oxide (NiO) has received lots of attention in the semiconductor industry. Its resistance switching characteristics of NiO thin films show its potential applications for the next generation nonvolatile resistive random access memory (ReRAM) devices.

Heindirk torn Dieck reported two DAD ligands in their dianionic form ($DAD^{(II)}$) coordinate with titanium in its +IV oxidation state, as shown in the formula $Ti^{(IV)}(iPr_2\text{-}DAD^{(II)})_2$ and $Ti^{(IV)}(tBu_2\text{-}DAD^{(II)})_2$ (Heindirk tom Dieck at al., Inorganica Chimica Acta, 177, 1990, Pages 191-197). CVD using $Ti^{(IV)}(tBu_2\text{-}DAD^{(II)})_2$ was also reported (S. Van Der Ven et al., J. De Physique IV, Colloque C3, supplement au Journal de Physique 11, 3, 1993).

The synthesis of homoleptic nickel (0) molecules such as $Ni^{(0)}(R_2\text{-}DAD)_2$, where the nickel has the 0 oxidation state have already been reported (H. Tom Dieck Z. Naturforsch. 36b, 814-822, 1981). Two different methods were used for the preparation of these molecules. The first method is based on a ligand exchange by reacting the nickel (0) starting material $Ni(COD)_2$ with two equivalents of the corresponding neutral diazabutadiene. The second method consists of reducing the nickel (+II) starting material $NiBr_2(DME)$ with sodium in presence of the corresponding neutral diazabutadiene.

The synthesis of homoleptic nickel (+II) molecules such as $Ni^{(+II)}(R_2\text{-}DAD)_2$, where the nickel has the (+II) oxidation state have also been reported (T. J. Knisley Organometallics, 2011). In this case, the nickel (+II) starting material $Ni^{(+II)}Cl_2 \cdot CH_3CN$ was reacted with two equivalents of lithium diazadienyl which was beforehand prepared from the corresponding diazabutadiene reacted with one equivalent of freshly cut lithium metal.

Winter et al. report ALD deposition of $Ni_xN$ on 500 nm thick thermal $SiO_2$ using $Ni(tBu\text{-}DAD)_2$ and anhydrous 1,1-dimethylhydrazine (WO2012/027357). Self-limited film growth was achieved with pulse lengths greater than or equal to 4.0 seconds as evidenced by a constant growth rate of 0.7 A/cycle, but only at temperatures between 225° C. and 240° C.

Han reports CVD deposition of Ni films on silicon wafers using $Ni(iPr\text{-}DAD)_2$ (WO2012/067439). Auger spectroscopy analysis revealed that the resulting film contained approximately 10% carbon.

The deposition of nickel containing films (pure nickel, nickel oxide or nickel silicide) in CVD or ALD mode remains a challenge (high C, N or O content) due to the poor availability of suitable precursors. Applicants believe that no oxygen-free precursors allow deposition of pure nickel films in CVD or ALD (thermal or plasma mode) at temperatures lower than 250° C. or 150° C. using an oxygen-free reaction gas. The nickel precursors currently available are too stable and therefore do not allow deposition at low temperature A need remains for nickel containing precursors suitable for CVD or ALD in an oxygen-free process. Desirable properties of the nickel containing precursors for these applications are: i) liquid form or low melting point solid; ii) high volatility; iii) sufficient thermal stability to avoid decomposition during handling and delivery; and iv) appropriate reactivity during CVD/ALD process. At the same time, in order to allow the deposition at low temperature the thermal stability should not be too high. 0 oxidation state metal precursors are known to have less thermal stability compared to their oxidized forms.

Notation and Nomenclature

Certain abbreviations, symbols, and terms are used throughout the following description and claims, and include:

As used herein, the indefinite article "a" or "an" means one or more.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the term "aryl group" refers to a ligand derived from an aromatic molecule, such as phenyl, benzyl, tolyl, o-xylol, etc.

As used herein, the abbreviation "Me" refers to a methyl group; the abbreviation "Et" refers to an ethyl group; the abbreviation "Pr" refers to a n-propyl group; the abbreviation "iPr" refers to an isopropyl group; the abbreviation "Bu" refers to butyl (n-butyl), the abbreviation "tBu" refers to a tert-butyl; the abbreviation "sBu" refers to a sec-butyl; the abbreviation "COD" refers to cyclooctadiene; the abbreviation "THF" refers to tetrahydrofuran; and the abbreviation "DME" refers to dimethoxy ethane.

The standard abbreviations of the elements from the periodic table of elements are used herein. It should be understood that elements may be referred to by these abbreviations (e.g., Ni refers to nickel, Si refers to silicon, C refers to carbon, etc.).

As used herein, the abbreviation "DAD" refers to 1,4-diazabuta-1,3-diene ligand, an α-diimine which has general structure of $R_1$—N=$CR_3$—$CR_4$=N—$R_2$, wherein each $R_1$ to $R_4$ is independently selected from; H; C1-C6 linear, branched, or cyclic alkyl or aryl group; C1-C6 linear, branched, or cyclic alkylamino group such as NRR', where R and R' are independently selected from H or C1-C6 linear, branched, or cyclic alkyl or aryl group; C1-C6 linear, branched, or cyclic fluoroalkyl group (in which some or all of the substituents are F, i.e. partially or totally fluorinated); or an alkoxy substituent such as OR, where R is selected from H or a C1-C6 linear, branched, or cyclic alkyl or aryl group. As used herein "R-DAD" refers to the DAD ligand in which $R_1$ and $R_2$ are the "R" indicated and $R_3$ and $R_4$ are H (e.g., iPr-DAD is iPr—N=CH—CH=N-iPr).

The DAD ligand may be selected from one of three oxidation states, with each determining the bonding mode between the center element (M) and DAD ligands. X-ray fluorescence spectroscopy and/or X-ray crystal structure determination and/or magnetic moment determination may be used to determine oxidation state. For a better understanding, the generic structures of the DAD ligands are represented below with three different oxidation states: i) neutral, ii) mono-anionic, and iii) dianionic. One of ordinary skill in the art will recognize that the location of the double bonds in the diazabutadiene ligand changes based upon the oxidation state of the ligand, as shown below:

i) neutral DAD$^{(0)}$ ii) mono-anionic DAD$^{(-I)}$ iii) di-anionic DAD$^{(-II)}$ iv) neutral DAD$^{(0)}$ v) mono-anionic DAD$^{(-I)}$ vi) di-anionic DAD$^{(-II)}$ with neutral M bonds with mono-anionic M bonds with dianionic M bonds Even though written herein in linear form as $R_1$—N=$CR_3$—$CR_4$=N—$R_2$ (i.e., having two double bonds), the referenced DAD ligand may be neutral, monoanionic, or din anionic.

SUMMARY

Methods of depositing nickel containing films are disclosed. The nickel bis diazabutadiene precursors Ni(nPrN=CH—CH=NnPr)$_2$ and/or Ni(iPrN=CH—CH=NiPr)$_2$ are introduced into a reactor having at least one substrate disposed therein. At least part of the nickel bis diazabutadiene precursors is deposited onto the at least one substrate to form the nickel containing film. The disclosed methods may include one or more of the following aspects:
the nickel bis diazabutadiene precursor being Ni(nPrN=CH—CH∀NnPr)$_2$;
the method being performed at a temperature between about 20° C. and about 600° C.;
the method being performed at a temperature between about 100° C. and about 400° C.;
the method being performed at a pressure between about 0.1 Pa and about 10$^5$ Pa;
the method being performed at a pressure between about 2.5 Pa and about 10$^3$ Pa;
the deposition step being selected from the group consisting of chemical vapor deposition (CVD), atomic layer deposition (ALD), plasma CVD, plasma ALD, pulse CVD, low pressure CVD, sub-atmospheric CVD, atmospheric pressure CVD, hot-wire CVD, hot-wire ALD, and super critical fluid deposition;
introducing a reaction gas into the reactor at the same time or at an alternate time as the introduction of the nickel bis diazabutadiene precursor;
the reaction gas being a reducing agent;
the reducing agent being selected from the group consisting of: N$_2$, H$_2$; SiH$_4$; Si$_2$H$_6$; Si$_3$H$_8$; NH$_3$; (CH$_3$)$_2$SiH$_2$; (C$_2$H$_5$)$_2$SiH$_2$; (CH$_3$)SiH$_3$; (C$_2$H$_5$)SiH$_3$; phenyl silane; N$_2$H$_4$; N(SiH$_3$)$_3$; N(CH$_3$)H$_2$; N(C$_2$H$_5$)H$_2$; N(CH$_3$)$_2$H; N(C$_2$H$_5$)$_2$H; N(CH$_3$)$_3$; N(C$_2$H$_5$)$_3$; (SiMe$_3$)$_2$NH; (CH$_3$)HNNH$_2$; (CH$_3$)$_2$NNH$_2$; phenyl hydrazine; B$_2$H$_6$; 9-borabicyclo[3,3,1]nonane; dihydrobenzenfuran; pyrazoline; trimethylaluminium; dimethylzinc; diethylzinc; radical species thereof; and mixtures thereof;
the reaction gas being an oxidizing agent; and
the oxidizing agent being selected from the group consisting of: O$_2$; O$_3$; H$_2$O; H$_2$O$_2$; NO; NO$_2$; N$_2$O; carboxylic acids; radical species thereof; and mixtures thereof.
the nickel containing film being selected from the group consisting of nickel (Ni), nickel silicide (NiSi), nickel nitride (NiN), nickel carbide (NiC), nickel carbonitride (NiNC), and nickel oxide (NiO);
Also disclosed are ALD methods of depositing a nickel silicide film. At least one nickel bis diazabutadiene precursor selected from Ni(nPrN=CH—CH=NnPr)$_2$ or Ni(iPrN=CH—CH=NiPr)$_2$ is introduced into a reactor having at least one substrate disposed therein. At least part of the nickel bis diazabutadiene precursor is deposited onto the at least one substrate to form a nickel containing layer. At least one silicon containing precursor is introduced into the reactor. At least part of the silicon containing precursor is deposited onto the nickel containing layer to form the nickel silicide film. The disclosed methods may include one or more of the following aspects:
repeating the method to deposit the nickel silicide film having a thickness ranging from approximately 5 nm to approximately 100 nm;
the silicon containing precursor being selected from the group consisting of silane; chlorosilane; dichlorosilane; trichlorosilane; N(SiH$_3$)$_3$; a silane having the formula Si$_x$H$_y$X$_{2x+2-y}$, wherein X=F, Cl, Sr, or I, x=2-3, and y=1-8; or an aminosilane having the formula SiR$^1$$_x$(NR$^2$$_2$)$_{4-x}$, wherein x=0-3, each R$^1$ is independently H or a C1-C6 alkyl group, and each R$^2$ is independently a C1-C6 alkyl group; and mixtures thereof;
introducing a reaction gas into the reactor at the same time or at an alternate time as the introduction of the nickel bis diazabutadiene precursor;
introducing a reaction gas into the reactor at the same time or at an alternate time as the introduction of the silicon containing precursor;
the reaction gas being selected from the group consisting of: N$_2$, H$_2$; SiH$_4$; Si$_2$H$_6$; Si$_3$H$_8$; NH$_3$; (CH$_3$)$_2$SiH$_2$; (C$_2$H$_5$)$_2$SiH$_2$; (CH$_3$)SiH$_3$; (C$_2$H$_5$)SiH$_3$; phenyl silane; N$_2$H$_4$; N(SiH$_3$)$_3$; N(CH$_3$)H$_2$; N(C$_2$H$_5$)H$_2$; N(CH$_3$)$_2$H; N(C$_2$H$_5$)$_2$H; N(CH$_3$)$_3$; N(C$_2$H$_5$)$_3$; (SiMe$_3$)$_2$NH; (CH$_3$)HNNH$_2$; (CH$_3$)$_2$NNH$_2$; phenyl hydrazine; B$_2$H$_6$; 9-borabicyclo[3,3,1]nonane; dihydrobenzenfuran; pyrazoline; trimethylaluminium; dimethylzinc; diethylzinc; radical species thereof; and mixtures thereof; and
annealing the nickel silicide film.

BRIEF DESCRIPTION OF THE DRAWINGS

For a further understanding of the nature and objects of the present invention, reference should be made to the following detailed description, taken in conjunction with the accompanying drawings, wherein.

DETAILED DESCRIPTION OF PREFERRED EMBODIMENTS

Disclosed are nickel bis diazabutadiene (Ni(R-DAD)$_2$) precursors. These precursors may allow nickel containing film deposition at lower temperatures due to the adequate thermal stability of the precursor. The precursors may be used for deposition of films with controlled thickness and composition at targeted temperatures.
The disclosed nickel bis diazabutadiene (Ni(R-DAD)$_2$) precursor have the following formula (A):

(A)

wherein each of R$_1$ and R$_2$ are iPr or nPr and R$_3$ and R$_4$ are H.
The disclosed nickel bis diazabutadiene precursors have lower thermal stability than other nickel-containing precursors due to nickel having an oxidation state of 0. This allows deposition of nickel-containing films at lower temperatures than prior art nickel-containing precursors. The oxygen-free precursors also allow deposition of pure Ni films in CVD or ALD (thermal or plasma mode) at temperatures lower than 250° C., preferably lower than 150° C. using an oxygen-free reaction gas. The disclosed nickel bis diazabutadiene precursors are homoleptic, permitting synthesis in one step, which enables a lower synthesis cost. The bonding of the nickel element to only nitrogen helps to reduce incorporation of other elemental impurities into the film. The disclosed nickel bis diazabutadiene precursors may be used for the deposition a thin nickel containing film wherein the nickel containing film is nickel (Ni), nickel silicide (NiSi), nickel nitride (NiN), nickel carbide (NiC), nickel carbonitride (NiNC), nickel oxide (NiO), or any other nickel containing film The disclosed nickel bis diazabutadiene precursors are not commercially available, but may be synthesized according to the published method in H. Tom Dieck Z. Naturforsch. 36b, 814-822, 1981, which is incorporated herein in its entirety by reference. More particularly, one molar equivalent of $Ni(COD)_2$ may be reacted with 2 or more molar equivalents of the diazadiene ligand to produce the disclosed nickel bis diazabutadiene precursors. More synthesis details are provided in the Examples that follow. Except for the diazabutadiene ligands, all of the reactants are commercially available.

The relevant diazabutadiene ligands may also be prepared according the method published in H. Tom Dieck Z. Naturforsch. 36b, 814-822, 1981. More particularly, the diazabutadiene ligand may be synthesized by reacting one molar equivalent of the relevant glyoxal (O=CH—CH=O, O=CH—CMe=O, O=C(CF$_3$)CH=O, etc) with two or more molar equivalents of an amine (RNH$_2$) to produce the relevant diazabutadiene (RN=CH—CH=NR, RN=CH—CMe=NR, RN=C(CF$_3$)CH=NR, etc.).

Also disclosed are methods for forming a nickel-containing layer on a substrate using a vapor deposition process. The method may be useful in the manufacture of semiconductor, photovoltaic, LCD-TFT, or flat panel type devices.

The nickel containing film may be deposited by introducing at least one of the disclosed $Ni(R-DAD)_2$ precursors discussed above into a reactor having at least one substrate disposed therein. At least part of the disclosed $Ni(R-DAD)_2$ precursor is deposited onto the at least one substrate to form the nickel containing film.

The disclosed $Ni(R-DAD)_2$ precursors may be used to deposit thin nickel-containing films using any deposition methods known to those of skill in the art. Examples of suitable deposition methods include without limitation, conventional chemical vapor deposition (CVD) or atomic layer deposition (ALD), or other types of deposition that are related to vapor coating, using techniques such as plasma [plasma enhanced chemical vapor deposition (PECVD) or plasma enhanced atomic layer deposition (PEALD)], tuned introduction schemes [pulsed chemical vapor deposition (PCVD)], tuned reaction pressure [low pressure chemical vapor deposition (LPCVD), subatmospheric CVD (SACVD), atmospheric pressure CVD (APCVD)], hot-wire chemical vapor deposition (HWCVD, also known as catCVD, in which a hot wire serves as a catalyst for the deposition process), hot-wire atomic layer deposition (HWALD), or super critical fluid incorporated deposition, or combinations thereof. In one alternative, a thermal CVD deposition is preferred, particularly when fast growth, conformality, process-orientation and one direction films are required. In another alternative, a thermal ALD deposition process is preferred, particularly when superior conformality of films deposited on challenging surfaces (e.g., trenchs, holes, vias) is required.

The disclosed $Ni(R-DAD)_2$ precursors may be supplied either in neat form or in a blend with a suitable solvent, such as ethyl benzene, xylene, mesitylene, decane, dodecane. The disclosed precursors may be present in varying concentrations in the solvent.

One or more of the neat $Ni(R-DAD)_2$ precursor or blend are introduced into a reactor in vapor form by conventional means, such as tubing and/or flow meters. The vapor form may be produced by vaporizing the neat precursor or blend through a conventional vaporization step such as direct vaporization, distillation, or by bubbling, or by using a sublimator such as the one disclosed in PCT Publication WO2009/087609 to Xu et al. The neat precursor or blend may be fed in liquid state to a vaporizer where it is vaporized before it is introduced into the reactor. Alternatively, the neat precursor or blend may be vaporized by passing a carrier gas into a container containing the precursor or blend or by bubbling the carrier gas into the precursor or blend. The carrier gas may include, but is not limited to, Ar, He, N$_2$, and mixtures thereof. Bubbling with a carrier gas may also remove any dissolved oxygen present in the neat precursor or blend. The carrier gas and precursor are then introduced into the reactor as a vapor.

If necessary, the container of disclosed precursor/blend may be heated to a temperature that permits the precursor/blend to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of precursor vaporized.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates onto which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium, or gold) may be used. The substrate may also have one or more layers of differing materials already deposited upon it from a previous manufacturing step.

The temperature and the pressure within the reactor are held at conditions suitable for vapor deposition of at least part of the $Ni(R-DAD)_2$ precursor onto the substrate. In other words, after introduction of the vaporized precursor into the chamber, conditions within the chamber are such that at least part of the vaporized precursor is deposited onto the substrate to form a nickel-containing film. For instance, the pressure in the reactor may be held between about 0.1 Pa and about $10^5$ Pa, more preferably between about 2.5 Pa and about 10 Pa, as required per the deposition parameters. Likewise, the temperature in the reactor may be held between about 20° C. and about 600° C., preferably between about 100° C. and about 400° C.

The temperature of the reactor may be controlled by controlling the temperature of the substrate holder and/or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 350° C. Alternatively, when a thermal process is performed, the deposition temperature may range from approximately 200° C. to approximately 600° C.

In addition to the disclosed precursor, a reaction gas may also be introduced into the reactor. The reaction gas may be an oxidizing agent such as one of $O_2$; $O_3$; $H_2O$; $H_2O_2$; oxygen containing radicals such as O. or OH.; NO; $NO_2$; $N_2O$; carboxylic acids such as formic acid, acetic acid, propionic acid; radical species of NO, $NO_2$, or the carboxylic acids; and mixtures thereof. Preferably, the oxidizing agent is selected from the group consisting of $O_2$, $O_3$, $H_2O$, $H_2O_2$, oxygen containing radicals thereof such as O. or OH., and mixtures thereof.

Alternatively, the reaction gas may be a reducing agent such as one of $H_2$) $NH_3$, $SiH_4$, $Si_2H_6$, $Si_3H_8$, $(CH_3)_2SiH_2$, $(C_2H_5)_2SiH_2$, $(CH_3)SiH_3$, $(C_2H_5)SiH_3$, phenyl silane, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, phenyl hydrazine, N-containing molecules, $B_2H_6$, 9-borabicyclo[3,3,1]nonane, dihydrobenzenfuran, pyrazoline, trimethylaluminium, dimethylzinc, diethylzinc, radical species thereof, and mixtures thereof. Preferably, the reducing agent is $H_2$, $NH_3$, $SiH_4$, $Si_2H_6$, $Si_3H_8$, $SiH_2Me_2$, $SiH_2Et_2$, $N(SiH_3)_3$, hydrogen radicals thereof, or mixtures thereof.

The reaction gas may be treated by a plasma, in order to decompose the reaction gas into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system, One of skill in the art will recognize methods and apparatus suitable for such plasma treatment.

The vapor deposition conditions within the chamber allow the Ni(R-DAD)$_2$ precursor and/or the reaction gas to form a nickel-containing film on the substrate. In some embodiments, Applicants believe that plasma-treating the reaction gas may provide the reaction gas with the energy needed to react with the disclosed precursor.

Depending on what type of film is desired to be deposited, a second precursor may be introduced into the reactor. The second precursor comprises another element source, such as silicon, copper, praseodymium, manganese, ruthenium, titanium, tantalum, bismuth, zirconium, hafnium, lead, niobium, magnesium, aluminum, lanthanum, or mixtures of these. When a second precursor is utilized, the resultant film deposited on the substrate may contain at least two different elements.

In one alternative, the second precursor may be a silicon containing precursor, such as silane; chlorosilane; dichlorosilane; trichlorosilane; $N(SiH_3)_3$; a silane having the formula $Si_xH_yX_{2x-2-y}$, wherein X=F, Cl, Br, or I, x=2-3, and y=0-6; or an aminosilane having the formula $SiR^1_x(NR^2_2)_{4-x}$, wherein x=0-3, each $R^1$ is independently H or a C1-C6 alkyl group, and each $R^2$ is independently a C1-C6 alkyl group; and combinations thereof. Exemplary silanes include disilane, trisilane, $Si_2Cl_6$, and $Si_2HCl_5$. Exemplary aminosilanes include bis(diethylamino)silane [$SiH_2(NEt_2)_2$] and diisopropylaminosilane [$SiH_3(NiPr_2)$]. The combination of the Ni(R-DAD)$_2$ precursor with the silicon containing precursor produces NiSi films having low resistivity (approximately 15 μohm·cm to approximately 20 μohm·cm) low Si consumption, and low temperature budget. Furthermore, the Ni diffusion in the Si is easily controlled. The NiSi films may be used as contact to source, drain, and gate in CMOS devices.

The Ni(R-DAD)$_2$ precursors and reaction gases may be introduced into the reactor either simultaneously (chemical vapor deposition), sequentially (atomic layer deposition) or different combinations thereof. The reactor may be purged with an inert gas between the introduction of the precursor and the introduction of the reaction gas. Alternatively, the reaction gas and the precursor may be mixed together to form a reaction gas/precursor mixture, and then introduced to the reactor in mixture form. Another example is to introduce the reaction gas continuously and to introduce the at least one Ni(R-DAD)$_2$ precursor by pulse (pulsed chemical vapor deposition).

The vaporized precursor and the reaction gas may be pulsed sequentially or simultaneously (e.g. pulsed CVD) into the reactor, Each precursor pulse may last for a time period ranging from about 0.01 seconds to about 10 seconds, alternatively from about 0.3 seconds to about 3 seconds, alternatively from about 0.5 seconds to about 2 seconds. In another embodiment, the reaction gas may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

Depending on the particular process parameters, deposition may take place for a varying length of time. Generally, deposition may be allowed to continue as long as desired or necessary to produce a film with the necessary properties, Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Ni(R-DAD)$_2$ precursor and a reaction gas are simultaneously introduced into the reactor. The two react to form the resulting nickel-containing thin film. When the reaction gas in this exemplary CVD process is treated with a plasma, the exemplary CVD process becomes an exemplary PECVD process. The reaction gas may be treated with plasma prior or subsequent to introduction into the chamber.

In one non-limiting exemplary ALD type process, the vapor phase of the disclosed Ni(R-DAD)$_2$ precursor is introduced into the reactor, where it is contacted with a suitable substrate, Excess precursor may then be removed from the reactor by purging and/or evacuating the reactor. A reducing agent (for example, $H_2$) is introduced into the reactor where it reacts with the absorbed precursor in a self-limiting manner. Any excess reducing agent is removed from the reactor by purging and/or evacuating the reactor. If the desired film is a nickel film, this two-step process may provide the desired film thickness or may be repeated until a film having the necessary thickness has been obtained. One of ordinary skill in the art will recognize that the desired film thickness will depend upon the type of film obtained and its location in the semiconductor, photovoltaic, LCD-TFT, or flat panel type device.

Alternatively, if the desired film contains two elements, the two-step process above may be followed by introduction of the vapor of a second precursor into the reactor. The second precursor will be selected based on the desired second element in the film being deposited. After introduction into the reactor, the second precursor is contacted with the substrate. Any excess second precursor is removed from the reactor by purging and/or evacuating the reactor. Once again, a reducing agent may be introduced into the reactor to react with the second precursor. Excess reducing agent is removed from the reactor by purging and/or evacuating the reactor. If a desired film thickness has been achieved, the process may be terminated. However, if a thicker film is desired, the entire fourstep process may be repeated. By alternating the provision of the Ni(R-DAD)$_2$ precursor, second precursor, and reaction gas, a film of desired composition and thickness can be deposited. One of ordinary skill in the art will recognize that the desired film thickness will depend upon the type of film obtained and its location in the semiconductor, photovoltaic, LCD-TFT, or flat panel type device.

When the reaction gas in this exemplary ALD process is treated with a plasma, the exemplary ALD process becomes an exemplary PEALD process. The reaction gas may be treated with plasma prior or subsequent to introduction into the chamber.

The nickel-containing films resulting from the processes discussed above may include a pure nickel (Ni), nickel nitride (NiN), nickel carbide (NiC), nickel carbonitride (NiCN), nickel silicide (Ni$_k$Si$_l$), or nickel oxide (Ni$_n$O$_m$) film, wherein k, l, m, and n are integers which inclusively range from 1 to 6. One of ordinary skill in the art will recognize that by judicial selection of the appropriate Ni(R-DAD)$_2$ precursor, optional second precursors, and reaction gas species, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the nickel-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 400° C. for 3600 seconds under a H-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the nickel-containing film. This in turn tends to improve the resistivity of the film.

After annealing, the nickel-containing films deposited by any of the disclosed processes have a bulk resistivity at room temperature of approximately 7 μohm·cm to approximately 70 μohm·cm, preferably approximately 7 μohm·cm to approximately 20 μohm·cm, and more preferably approximately 7 μohm·cm to approximately 12 μohm·cm. Room temperature is approximately 20° C. to approximately 28° C. depending on the season. Bulk resistivity is also known as volume resistivity. One of ordinary skill in the art will recognize that the bulk resistivity is measured at room temperature on Ni films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Example 1

Synthesis of Ni(iPrN=CH—CH=NiPr)$_2$

Ni(iPrN=CH—CH=NiPr)$_2$ was prepared according to the published method in H. Tom Dieck Z. Naturforsch. 36b, 814-822, 1981.

In a 100 mL schlenk flask under dry nitrogen, 1.0 g (3.63 mmol) of Ni(COD)$_2$ was introduced with diethylether (10 mL). Glyoxal-bis(isopropylimine) 1.02 g (7.27 mmol) was slowly added at room temperature and avowed to react overnight. The solution immediately turned dark red, Solvent was then removed under vacuum to give a red liquid. Distillation at 145° C.@300 mTorr yielded a dark red liquid 900 mg (73% yield) which NMR$^1$H shifts correspond to the structure of Ni(iPrN=CH—CH=NiPr)$_2$.

Example 2

Synthesis of Ni(tBuN=CH—CH=NtBu)$_2$

Ni(tBuN=CH—CH=NtBu)$_2$ was prepared according to the published method in H. Tom Dieck Z. Naturforsch. 36b, 814-822, 1981.

In a 100 mL schlenk flask under dry nitrogen, we introduced 1.0 g (3.63 mmol) of Ni(COD)$_2$ with diethylether (10 mL). Glyoxal-bis(tertiobutylimine) 1.22 g (7.27 mmol) was slowly added at room temperature and allowed to react overnight. Solution immediately turned to dark red. Solvent were then removed under vacuum to give a red solid, Sublimation at 130° C.@300 mTorr allowed to isolate a dark red solid 670 mg (55% yield) which NMR$^1$H shifts correspond to the structure of Ni(tBuN=CH—CH=NtBu)$_2$.

Example 3

Thermogravimetric (TGA) of Ni(iPrN=CH—CH=NiPr)$_2$ and Ni(tBuN=CH—CH=NtBu)$_2$

Figure 1:
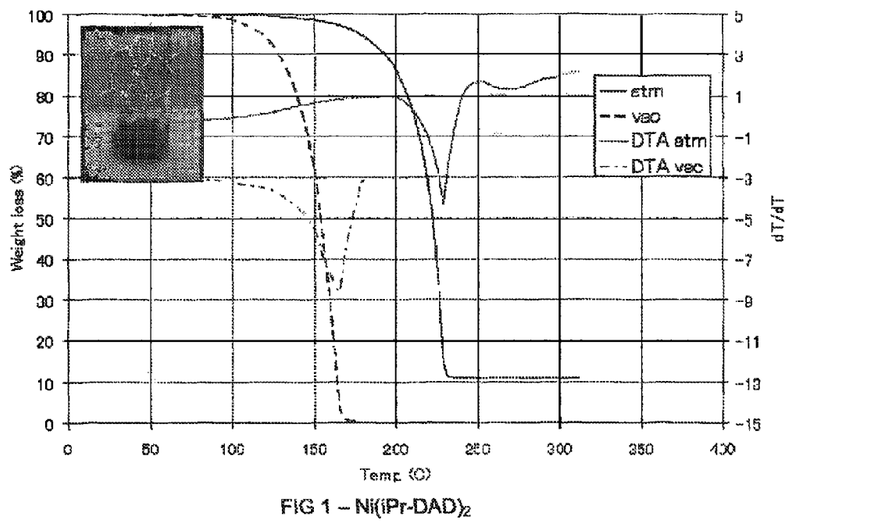
FIG. 1 is a graph showing the atmospheric and vacuum thermogravimetric analysis of Ni(iPrN=CH—CH=NiPr)$_2$.
Figure 2:
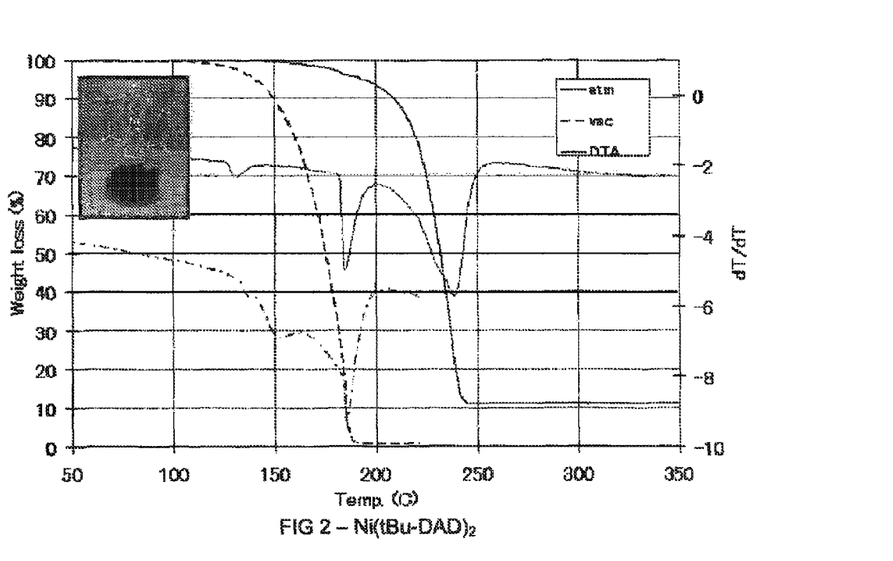
FIG. 2 is a graph showing the atmospheric and vacuum thermogravimetric analysis of Ni(tBuN=CH—CH=NtBu)$_2$

In FIGS. 1 and 2, the atmospheric and vacuum TGA and Differential Thermal Analysis (DTA) of Ni(iPrN=CH—CH=NiPr)$_2$ and Ni(tBuN=CH—CH=NtBu)$_2$ respectively are displayed (the atmospheric TGA and atmospheric DTA results are shown by the solid lines and the vacuum TGA and vacuum DTA results are shown by the dashed lines, with the TGA results starting in the upper left portion of the graph and proceeding towards the bottom right and the DTA results starting on the left in the middle of the graph).

As can be seen, Ni(iPr-DAD)$_2$ is more volatile than Ni(tBu-DAD)$_2$. The TGA of Ni(nPr-DAD)$_2$ is similar to that of Ni(iPr-DAD)$_2$. Ni(iPr-DAD)$_2$ produces 11% residuals at atmospheric TGA conditions and approximately 0% residuals at vacuum TGA conditions. Ni(nPr-DAD)$_2$ produces 13% residuals at atmospheric TGA conditions and less than 0.5% residuals at vacuum TGA conditions. Ni(tBu-DAD)$_2$ produced 11% residuals at atmospheric TGA conditions and 1% residuals at vacuum TGA conditions. Both Ni(iPr-DAD)2 and Ni(nPr-DAD)2 are liquids, which makes delivery to the deposition chamber easier than delivery of Ni(tBu-DAD)$_2$, which is a solid. Finally the vapor pressure of Ni(iPr-DAD)$_2$ [130° C. at 1 Torr] and Ni(nPr-DAD)$_2$[135° C. at 1 Torr] is better than that of Ni(tBu-DAD)$_2$. [155° C. at 1 Torr]. Furthermore stability testing of Ni(iPr-DAD)2 at 100° C. and 130° C. for 6 days showed very good stability at 100° C. (NMR+TGA), but some decomposition at 130° C.

Figure 3:
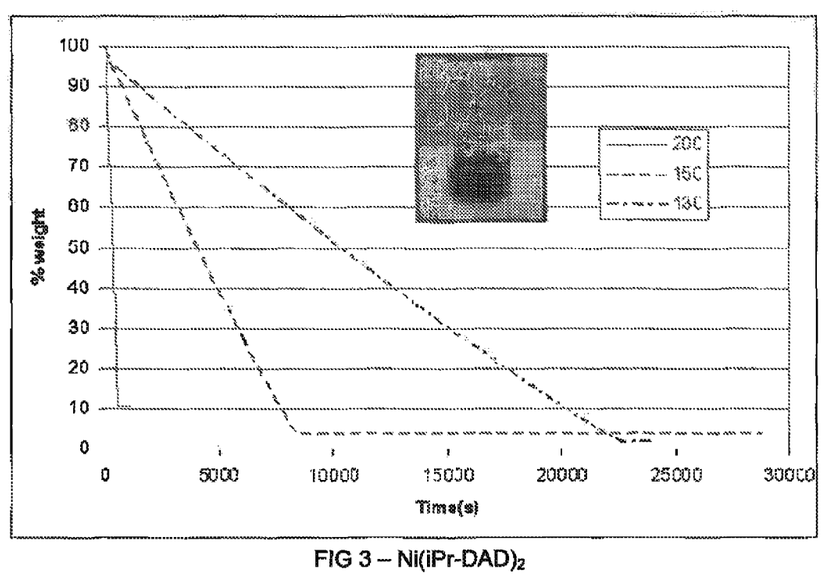
FIG. 3 is a graph showing isotherm evaporations of Ni(iPrN=CH—CH=NiPr)$_2$.

In FIG. 3, isotherm evaporations of Ni(iPrN=CH—CH=NiPr)$_2$ at temperatures in the range 130 to 200° C. are displayed. The residual amount is very little at 130° C., showing some good evidence of thermal stability in the present conditions. The residual amount gradually increases at 150° C. and 200° C. to 11%, exhibiting again that the relatively low thermal stability of the molecule may be suitable for low temperature depositions of nickel films.

Example 4

Prophetic Deposition of Thin Ni films using Ni(iPrN=CH—CH=NiPr)$_2$ or Ni(tBuN=CH—CH=NtBu)$_2$ Ni(iPrN=CH—CH=NiPr)$_2$ was synthesized as described in Example 1. It is expected to obtain Ni films using the following example, which describes one way, among others, to deposit such films.

The nickel molecule will be placed in a canister. Vapors of the nickel molecule will be transported to the reaction furnace by flowing nitrogen within the heated canister in order to provide enough vapor. Hydrogen will be introduced into the deposition system to react with the portion of the nickel precursor deposited at the surface of the wafer in an ALD scheme (introduction of precursors' vapors separated by sufficiently long inert gas purges). Hydrogen (H$_2$) is believed to be a molecule of choice, but any type of reducing agent may be selected. Ni films will be obtained. Analytical results will show that a saturation mode typical to ALD mode is obtained when extending the introduction time of the vapors of the nickel molecule.

Example 5

Prophetic Deposition of Thin NiSi films using Ni(iPrN=CH—CH=NiPr)$_2$ or Ni(tBuN=CH—CH=NtBu)$_2$ and SiH$_2$(NEt$_2$)$_2$ Ni(iPrN=CH—CH=NiPr)$_2$ was synthesized as described in Example 1. It is expected to obtain NiSi films using the following example, which describes one way, among others, to deposit such films.

The nickel molecule will be placed in a canister. Vapors of the nickel molecule will be transported to the reaction furnace by flowing nitrogen within the heated canister in order to provide enough vapor. Conditions within the reactor and the choice of substrate will be suitable for adsorption or chemisorptions of the nickel molecule on the substrate. The reactor will be purged and hydrogen will be introduced into the deposition system to react with the portion of the nickel precursor deposited on the surface of the substrate to leave a Ni containing layer. Hydrogen (H$_2$) is believed to be a molecule of choice, but any type of reducing agent may be selected. Vapors of SiH$_2$(NEt$_2$)$_2$ will be transported into the reaction furnace by flowing nitrogen within the heated canister in order to provide enough vapor. Conditions within the reactor will be suitable for a portion of the SiH$_2$(NEt$_2$)$_2$ vapors to react with the Ni containing layer to form a Ni containing and Si containing layer. The reactor will be purged and hydrogen will be introduced to react with the combination Ni containing and Si containing layer on the substrate to leave a NiSi film.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

We claim:

1. A method of depositing a nickel containing film, the method comprising:
   introducing at least one nickel bis diazabutadiene precursor into a reactor having at least one substrate disposed therein, the at least one nickel bis diazabutadiene precursor being Ni(nPrN=CH—CH=NnPr)$_2$ or Ni(iPrN=CH—CH=NiPr)$_2$; and
   depositing at least part of the nickel bis diazabutadiene precursor onto the at least one substrate to form the nickel containing film.

2. The method of claim 1, wherein the nickel bis diazabutadiene precursor is Ni(nPrN=CH—CH=NnPr)$_2$.

3. The method of claim 1, wherein the method is performed at a temperature between about 20° C. and about 600° C.

4. The method of claim 1, wherein the method is performed at a pressure between about 0.1 Pa and about $10^5$ Pa.

5. The method of claim 1, wherein the deposition step is selected from the group consisting of chemical vapor deposition (CVD), atomic layer deposition (ALD), plasma CVD, plasma ALD, pulse CVD, low pressure CVD, sub-atmospheric CVD, atmospheric pressure CVD, hot-wire CVD, hot-wire ALD, and super critical fluid deposition.

6. The method of claim 1, further comprising:
   introducing a reaction gas into the reactor at the same time or at an alternate time as the introduction of the nickel bis diazabutadiene precursor;
   wherein at least part of the nickel bis diazabutadiene precursor is deposited onto the at least one substrate to form the nickel containing film by reacting the reaction gas with the nickel bis diazabutadiene precursor.

7. The method of claim 6, wherein the reaction gas is a reducing agent.

8. The method of claim 7, wherein the reducing agent is selected from the group consisting of: N$_2$, H$_2$; SiH$_4$; Si$_2$H$_6$; Si$_3$H$_8$; NH$_3$; (CH$_3$)$_2$SiH$_2$; (C$_2$H$_5$)$_2$SiH$_2$; (CH$_3$)SiH$_3$; (C$_2$H$_5$) SiH$_3$; phenyl silane; N$_2$H$_4$; N(SiH$_3$)$_3$; N(CH$_3$)H$_2$; N(C$_2$H$_5$) H$_2$; N(CH$_3$)$_2$H; N(C$_2$H$_5$)$_2$H; N(CH$_3$)$_3$; N(C$_2$H$_5$)$_3$; (SiMe$_3$)$_2$ NH; (CH$_3$)HNNH$_2$; (CH$_3$)$_2$NNH$_2$; phenyl hydrazine; B$_2$H$_6$; 9-borabicyclo[3,3,1]nonane; dihydrobenzenfuran; pyrazoline; trimethylaluminium; dimethylzinc; diethylzinc; radical species thereof; and mixtures thereof.

9. The method of claim 6, wherein the reaction gas is an oxidizing agent.

10. The method of claim 9, wherein the oxidizing agent is selected from the group consisting of: O$_2$; O$_3$; H$_2$O; H$_2$O$_2$; NO; NO$_2$; N$_2$O; carboxylic acids; radical species thereof; and mixtures thereof.

11. The method of claim 1, wherein the nickel containing film is selected from the group consisting of nickel (Ni), nickel silicide (NiSi), nickel nitride (NiN), nickel carbide (NiC), nickel carbonitride (NiNC), and nickel oxide (NiO).

12. An ALD method of depositing a nickel silicide film, the method comprising:
   introducing at least one nickel bis diazabutadiene precursor into a reactor having at least one substrate disposed therein, the at least one nickel bis diazabutadiene precursor being Ni(nPrN=CH—CH=NnPr)$_2$ or Ni(iPrN=CH—CH=NiPr)$_2$;

depositing at least part of the nickel bis diazabutadiene precursor onto the at least one substrate to form a nickel containing layer;

introducing at least one silicon containing precursor into the reactor;

depositing at least part of the silicon containing precursor onto the nickel containing layer to form the nickel silicide film.

13. The method of claim 12, further comprising repeating the method to deposit the nickel silicide film having a thickness ranging from approximately 5 nm to approximately 100 nm.

14. The method of claim 12, wherein the silicon containing precursor is selected from the group consisting of: silane; chlorosilane; dichlorosilane; trichlorosilane; $N(SiH_3)_3$; a silane having the formula $Si_xH_yX_{2x+2-y}$, wherein X=F, Cl, Br, or I, x=2-3, and y=1-8; or an aminosilane having the formula $SiR^1_x(NR^2_2)_{4-x}$, wherein x=0-3, each $R^1$ is independently H or a C1-C6 alkyl group, and each $R^2$ is independently a C1-C6 alkyl group; and mixtures thereof.

15. The method of claim 12, further comprising introducing a reaction gas into the reactor at the same time or at an alternate time as the introduction of the nickel bis diazabutadiene precursor.

16. The method of claim 12, further comprising introducing a reaction gas into the reactor at the same time or at an alternate time as the introduction of the silicon containing precursor.

17. The method of claim 16, wherein the reaction gas is selected from the group consisting of: $N_2$, $H_2$; $SiH_4$, $Si_2H_6$; $Si_3H_8$; $NH_3$; $(CH_3)_2SiH_2$; $(C_2H_5)_2SiH_2$; $(CH_3)SiH_3$; $(C_2H_5)SiH_3$; phenyl silane; $N_2H_4$; $N(SiH_3)_3$; $N(CH_3)H_2$; $N(C_2H_5)H_2$; $N(CH_3)_2H$; $N(C_2H_5)_2H$; $N(CH_3)_3$; $N(C_2H_5)_3$; $(SiMe_3)_2NH$; $(CH_3)HNNH_2$; $(CH_3)_2NNH_2$; phenyl hydrazine; $B_2H_6$; 9-borabicyclo[3,3,1]nonane; dihydrobenzenfuran; pyrazoline; trimethylaluminium; dimethylzinc; diethylzinc; radical species thereof; and mixtures thereof.

18. The method of claim 12, further comprising annealing the nickel silicide film.

\* \* \* \* \*